United States Patent
Reeder et al.

(10) Patent No.: US 7,592,810 B2
(45) Date of Patent: Sep. 22, 2009

(54) MRI METHODS FOR COMBINING SEPARATE SPECIES AND QUANTIFYING A SPECIES

(75) Inventors: Scott B. Reeder, Middleton, WI (US); Charles A. McKenzie, London (CA); Jean H. Brittain, Middleton, WI (US)

(73) Assignees: The Board of Trustees of the Leland Stanford Junior University, Palo Alto, CA (US); General Electric Company, Schenectady, NY (US)

( * ) Notice: Subject to any disclaimer, the term of this patent is extended or adjusted under 35 U.S.C. 154(b) by 131 days.

(21) Appl. No.: 11/738,339

(22) Filed: Apr. 20, 2007

(65) Prior Publication Data

US 2007/0285094 A1    Dec. 13, 2007

Related U.S. Application Data

(60) Provisional application No. 60/745,602, filed on Apr. 25, 2006.

(51) Int. Cl.
    *G01V 3/00* (2006.01)
(52) U.S. Cl. ........................ 324/309; 324/307
(58) Field of Classification Search .............. 324/307, 324/309
    See application file for complete search history.

(56) References Cited

U.S. PATENT DOCUMENTS

| | | | |
|---|---|---|---|
| 5,810,726 A | 9/1998 | Van Vaals et al. | |
| 5,830,143 A | 11/1998 | Mistretta et al. | |
| 5,910,728 A | 6/1999 | Sodickson | |
| 5,976,088 A | 11/1999 | Urbano et al. | |
| 6,086,537 A | 7/2000 | Urbano et al. | |
| 6,228,030 B1 | 5/2001 | Urbano et al. | |
| 6,252,979 B1 | 6/2001 | Lee et al. | |
| 6,289,232 B1 | 9/2001 | Jakob et al. | |
| 6,377,045 B1 | 4/2002 | Van Den Brink et al. | |
| 6,583,623 B1* | 6/2003 | Kwok et al. | 324/307 |
| 6,605,943 B1 | 8/2003 | Clark et al. | |
| 6,714,010 B2 | 3/2004 | Madore | |
| 6,836,114 B2 | 12/2004 | Reddy et al. | |
| 6,903,551 B2 | 6/2005 | Madore | |
| 7,151,370 B1* | 12/2006 | Hargreaves | 324/307 |
| 7,176,683 B2 | 2/2007 | Reeder et al. | |
| 7,199,583 B2 | 4/2007 | Ikezaki | |
| 7,298,144 B2 | 11/2007 | Reeder et al. | |
| 7,332,909 B2 | 2/2008 | Schaffter et al. | |
| 7,349,729 B2 | 3/2008 | Reeder et al. | |
| 7,394,252 B1 | 7/2008 | Lin | |
| 7,397,242 B2 | 7/2008 | Samsonov et al. | |

(Continued)

OTHER PUBLICATIONS

An et al., "Chemical Shift Imaging with Spectrum Modeling", Magn. Reson. Med. (2001) 46(1):126-130.

(Continued)

*Primary Examiner*—Brij B. Shrivastav
*Assistant Examiner*—Megann E Vaughn
(74) *Attorney, Agent, or Firm*—Beyer Law Group LLP

(57) ABSTRACT

A method for generating a magnetic resonance images is provided. A first species signal for a first species is generated from magnetic resonance data. A second signal is generated from the magnetic resonance data. The first species signal is combined with the second signal to provide a recombined image. The recombined image may be displayed.

15 Claims, 10 Drawing Sheets

U.S. PATENT DOCUMENTS

| | | | |
|---|---|---|---|
| 7,418,287 | B2 | 8/2008 | Tsao et al. |
| 2005/0148852 | A1 | 7/2005 | Hargreaves |
| 2007/0247153 | A1 | 10/2007 | Yu et al. |

OTHER PUBLICATIONS

An et al., "Water-Fat Imaging with Three Orthogonal-Phase Acquisitions", Proceedings $6^{th}$ Scientific Meeting, International Society for Magnetic Resonance in Medicine (1998), 1866.

Brau et al., "Accelerated IDEAL Water-Fat Separation Techniques for Single- and Multi-Coil Applications", Proc. Intl. Soc. Mag. Reson. Med. 13 (2005) p. 491.

Bydder et al., "Fat Quantification by Modeling the Variation in Signal Amplitude with TE", Proc. Intl. Soc. Mag. Reson. Med. 14 (2006) p. 2298.

Dixon, "Simple Proton Spectroscopic Imaging", Radiology (1984) 153:189-194.

Fernandez-Real et al., "Cross-Talk between Iron Metabolism and Diabetes", Diabetes (2002), 51(8):2348-2354.

George et al., "Increased Hepatic Iron Concentration in Nonalcoholic Steatohepatitis is Associated with Increased Fibrosis", Gastroenterology (1998), 114(2):311-318.

Glover, G., "Multipoint Dixon Technique for Water and Fat Proton and Susceptibility Imaging", Journal of Magnetic Resonance Imaging (1991), 1:521-530.

McKenzie et al., "Abdominal Three Point Dixon Imaging with Self Calibrating Parallel MRI", in Proc. Intl. Soc. Mag. Reson. Med. 11 (2004), p. 917.

Moirand et al., "A New Syndrome of Liver Iron Overload with Normal Transferin Saturation", The Lancet (1997); 349 (9045):95-97.

Pineda et al., "Cramer-Rao Bounds for Three-Point Decomposition of Water and Fat", Magn. Reson. Med. (2005) 54(3):625-635.

Reeder et al., "Iterative Decomposition of Water and Fat with Echo Asymmetry and Least-Squares Estimation (IDEAL): Application with Fast Spin-Echo Imaging", Magn. Reson. Med. (2005), 54(3):636-644.

Reeder et al., "Multicoil Dixon Chemical Species Separation with an Iterative Least-Squares Estimation Method", Magn. Reson. Med. (2004) 51:35-45.

Westphalen et al., "Liver Fat: Effect of Hepatic Iron Deposition on Evaluation with Opposed-Phase MR Imaging", Radiology (2007), 242(2):450-455.

Wieben et al., "Multi-Echo Balanced SSFP Imaging for Iterative Dixon Reconstruction", Proc. Intl. Soc. Mag. Reson. Med. 13 (2005), p. 2386.

Yu et al., "Field Map Estimation with a Region Growing Scheme for Iterative 3-Point Water-Fat Decomposition", Magn. Reson. Med. (2005) 54(3):1032-1039.

Yu et al., "Single Acquisition Water-Fat Separation: Feasibility Study for Dynamic Imaging", Magn. Reson. Med. (2006) 55(2): 413-422.

Yu et al., "Single Quadrature Echo Water-Fat Separation with Robust Phase Correction", Proc. Intl. Soc. Mag. Reson. Med. 14 (2006), p. 2446.

U.S. Appl. No. 10/690,230, by Reeder et al. entitled "Magnetic Resonance Imaging of Different Chemical Species in a System Having Magnetic Field Heterogeneities", filed on Oct. 23, 2003 (published).

Office Action dated May 28, 2008 from U.S. Appl. No. 11/738,350.
Office Action dated Jun. 18, 2008 from U.S. Appl. No. 11/738,345.
Notice of Allowance dated Aug. 22, 2008 from U.S. Appl. No. 11/738,350.
Notice of Allowance dated Sep. 22, 2008 from U.S. Appl. No. 11/738,340.
Notice of Allowance dated Nov. 13, 2008 from U.S. Appl. No. 11/738,345.
Notice of Allowance dated Sep. 29, 2008 from U.S. Appl. No. 11/738,347.
Office Action dated Dec. 29, 2008 from U.S. Appl. No. 11/738,343.

* cited by examiner

US 7,592,810 B2

MRI METHODS FOR COMBINING SEPARATE SPECIES AND QUANTIFYING A SPECIES

CROSS REFERENCE TO RELATED APPLICATIONS

This application claims priority under 35 U.S.C. §119 from U.S. Provisional Patent Application No. 60/745,602, filed Apr. 25, 2006, entitled MRI METHODS FOR COMBINING SEPARATE SPECIES AND QUANTIFYING A SPECIES which is incorporated herein by reference for all purposes.

BACKGROUND OF THE INVENTION

This invention relates generally to magnetic resonance imaging of an object having different chemical species therein, such as fat and water, and more particularly the invention relates to species imaging in the presence of magnetic field heterogeneity.

Reliable and uniform fat suppression is essential for accurate diagnoses in many areas of MRI. This is particularly true for sequences such as fast spin-echo (FSE), steady-state free precession (SSFP) and gradient echo (GRE) imaging, in which fat is bright and may obscure underline pathology. Although conventional fat saturation may be adequate for areas of the body with relative homogeneous $B_o$ field, there may be many applications in which fat saturation routinely fails. This is particularly true for extremity imaging, off-isocenter imaging, large field of view (FOV) imaging, and challenging areas such as the brachial plexus and skull based, as well as many others. Short-TI inversion recovery (STIR) imaging provides uniform fat suppression, but at a cost of reduced signal-to-noise ratio (SNR) and mixed contrast that is dependent on $T_1$. This latter disadvantage limits STIR imaging to $T_2$ weighted ($T_2W$) applications, such that current $T_1$ weighted ($T_1 W$) applications rely solely on conventional fat-saturation methods. Another fat suppression technique is the use of spectral-spatial or water selective pulses; however, this method is also sensitive to field inhomogeneities.

"In and Out of Phase" Imaging was first described by Dixon in "Simple Proton Spectroscopic Imaging", Radiology (1984) 153:189-194, and was used to exploit the difference in chemical shifts between water and fat and in order to separate water and fat into separate images. Glover et al. further refined this approach, described in Glover G., "Multipoint Dixon Technique for Water and Fat Proton and Susceptibility Imaging", Journal of Magnetic Resonance Imaging (1991) 1:521-530, with a 3-point method that accounts for magnetic field inhomogeneities created by susceptibility differences. This method was applied with FSE imaging by acquiring three images with the readout centered at the spin-echo for one image and symmetrically before and after the spin-echo in the subsequent two images.

SUMMARY OF THE INVENTION

To achieve the foregoing and in accordance with the purpose of the present invention, a method for generating a magnetic resonance images is provided. A first species signal for a first species is generated from magnetic resonance data. A second signal is generated from the magnetic resonance data. The first species signal is combined with the second signal to provide a recombined image.

In another manifestation of the invention method for generating a magnetic resonance images is provided. A magnetic resonance imaging excitation is applied. Magnetic resonance data is acquired. A fat species signal is generated from the acquired magnetic resonance data. A water species signal is generated from the acquired magnetic resonance data. The fat species signal is mathematically combined with the water species signal to provide a recombined image. The recombind image is displayed.

In another manifestation of the invention an apparatus for providing magnetic resonance images is provided. A magnet system is provided. A controller is electrically connected to the magnet system. The controller comprises display, at least one processor, and computer readable media. The computer readable media comprises computer readable code for signaling the magnetic system to apply a magnetic resonance imaging excitation, computer readable code for signaling the magnetic system to acquire magnetic resonance data, computer readable codes for generating a fat species signal from the acquired magnetic resonance data, computer readable code for generating a water species signal from the acquired magnetic resonance data, computer readable code for mathematically combining the fat species signal with the water species signal to provide a recombined image, and computer readable code for displaying the recombined image.

The invention, objects, and features thereof will be more readily apparent from the following detailed description and appended claims when taken with the drawings.

DETAILED DESCRIPTION OF ILLUSTRATED EMBODIMENTS

Figure 2:
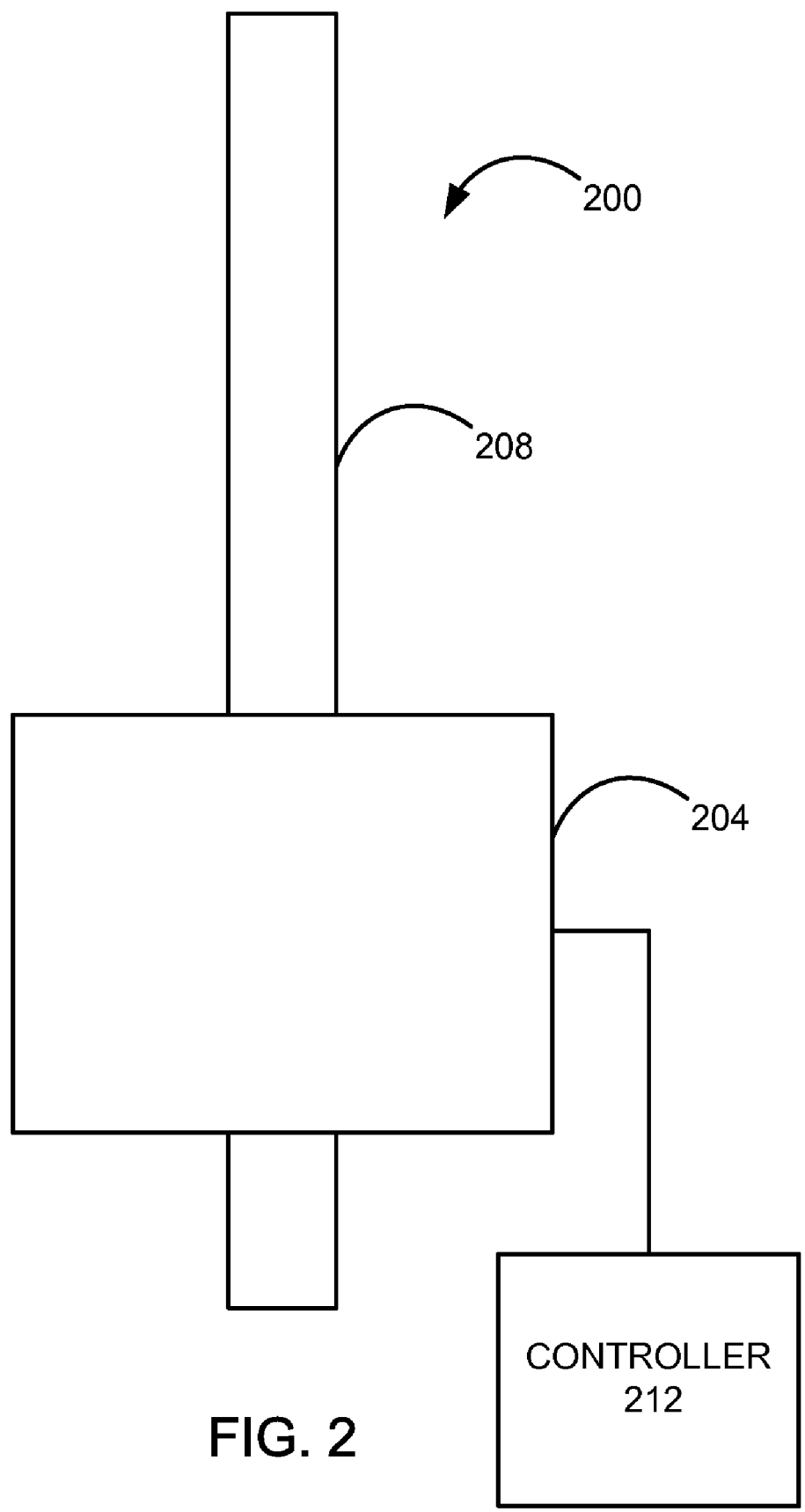
FIG. 2 is a schematic top view of a magnetic resonance imaging (MRI) system 200 that may be used in an embodiment of the invention.

FIG. 2 is a schematic top view of a magnetic resonance imaging (MRI) system 200 that may be used in an embodiment of the invention. The MRI system 200 comprises a magnet system 204, a patient transport table 208 connected to the magnet system, and a controller 212 controllably connected to the magnet system. In one example, a patient would lie on the patient transport table 208 and the magnet system 204 would pass around the patient. The controller 212 would control magnetic fields and radio frequency (RF) signals provided by the magnet system 204 and would receive signals from detectors in the magnet system 204.

Figure 3A:
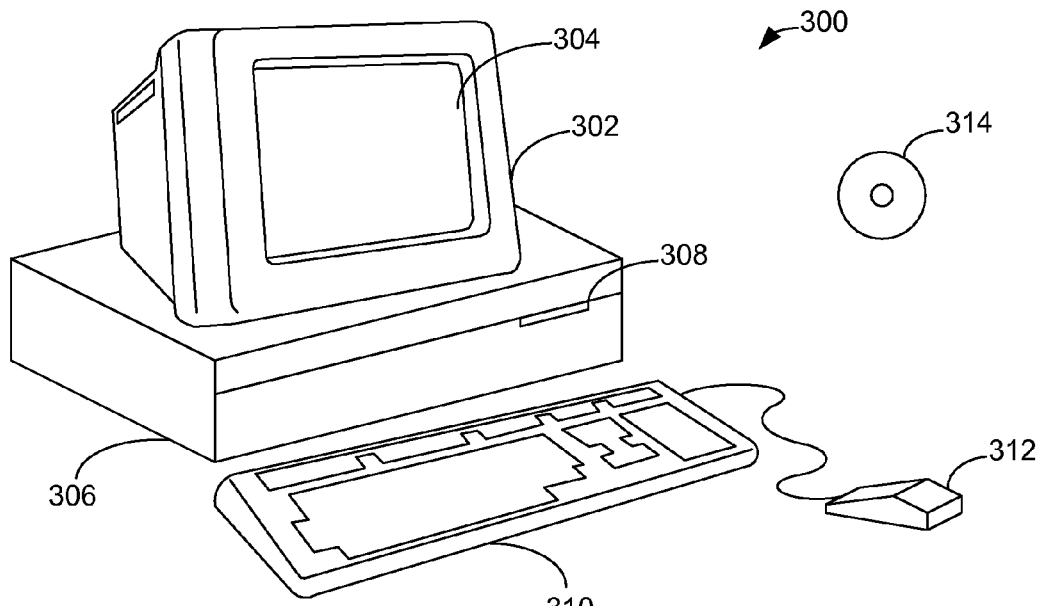
FIGS. 3A and 3B illustrate a computer system, which is suitable for implementing a controller 212 used in embodiments of the present invention.
Figure 3B:
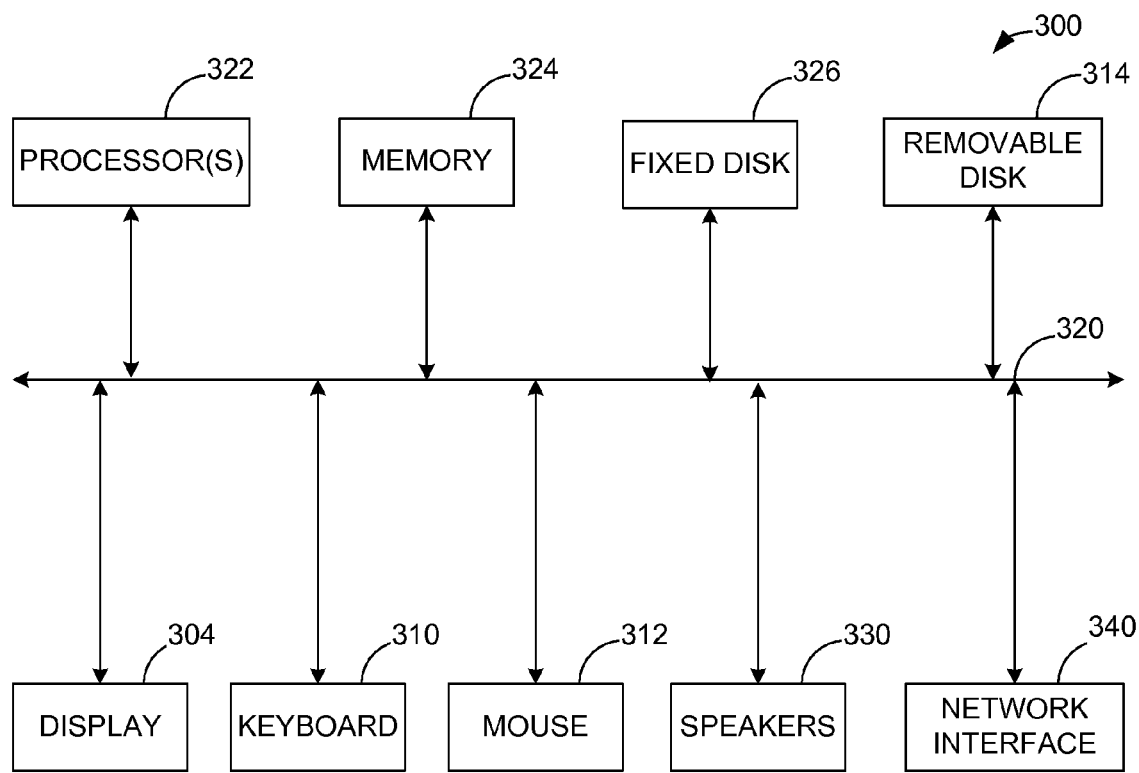

FIGS. 3A and 3B illustrate a computer system 300, which is suitable for implementing a controller 212 used in embodiments of the present invention. FIG. 3A shows one possible physical form of the computer system. Of course, the computer system may have many physical forms ranging from an integrated circuit, a printed circuit board, and a small handheld device up to a huge super computer. Computer system 300 includes a monitor 302, a display 304, a housing 306, a disk drive 308, a keyboard 310, and a mouse 312. Disk 314 is a computer-readable medium used to transfer data to and from computer system 300.

FIG. 3B is an example of a block diagram for computer system 300. Attached to system bus 320 are a wide variety of subsystems. Processor(s) 322 (also referred to as central processing units, or CPUs) are coupled to storage devices, including memory 324. Memory 324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 326 is also coupled bi-directionally to CPU 322; it provides additional data storage capacity and may also include any of the computer-readable media described below. Fixed disk 326 may be used to store programs, data, and the like and is typically a secondary storage medium (such as a hard disk) that is slower than primary storage. It will be appreciated that the information retained within fixed disk 326 may, in appropriate cases, be incorporated in standard fashion as virtual memory in memory 324. Removable disk 314 may take the form of the computer-readable media described below.

CPU 322 is also coupled to a variety of input/output devices, such as display 304, keyboard 310, mouse 312, and speakers 330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 322 optionally may be coupled to another computer or telecommunications network using network interface 340. With such a network interface, it is contemplated that the CPU might receive information from the network, or might output information to the network in the course of performing the above-described method steps. Furthermore, method embodiments of the present invention may execute solely upon CPU 322 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 1:
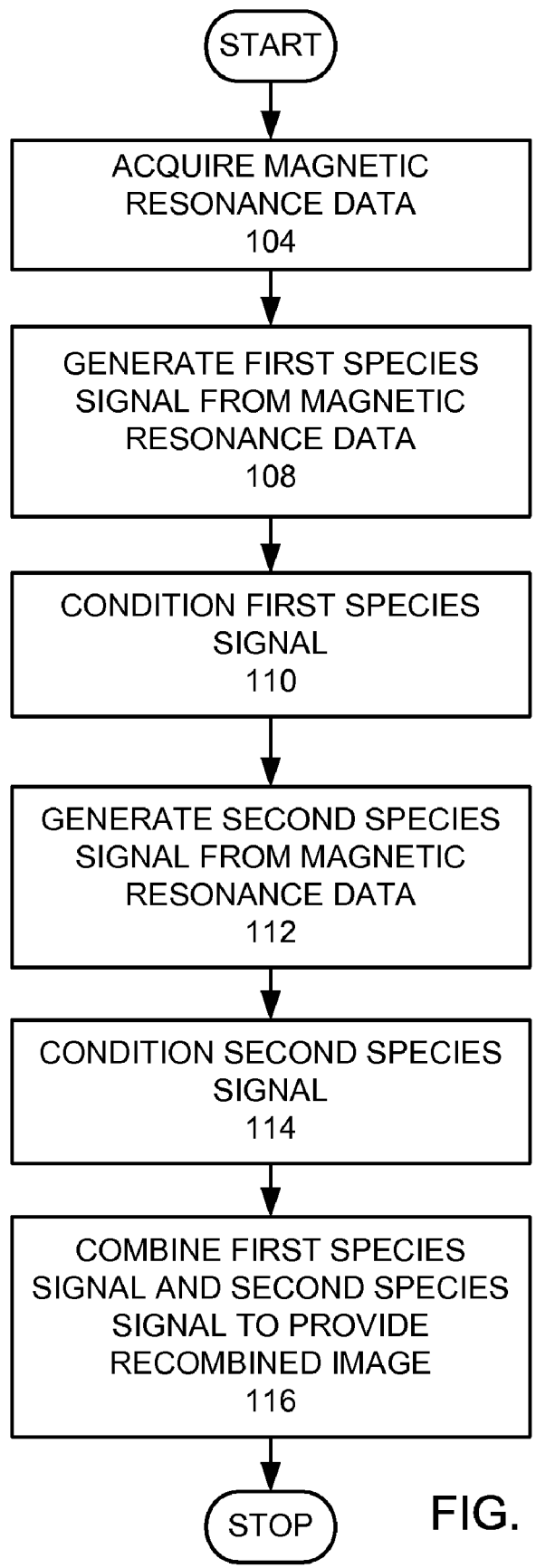
FIG. 1 is a high level flow chart of an embodiment of the invention.

FIG. 1 is a high level flow chart of an embodiment of the invention. Magnetic resonance data is acquired (step 104). In the acquiring of magnetic resonance data, the controller uses magnet system 204 and patient transport table 208 to generate and detect data, which is acquired by the controller 212. A first species signal is generated from the magnetic resonance data (step 108). An example of a first species may be fat. The first species signal is conditioned (step 110). The conditioning may provide chemical shift, rescale intensity, weighting, shifted in space, rotated, or another re-orientation, or another mathematical operation may be performed on the first species signal. Other embodiments may not provide this conditioning step.

A second species signal is generated from the magnetic resonance data (step 112). An example of a second species may be water, so that the first species and second species are different. Preferably, the magnetic resonance data used to generate the second species signal is used to generate the first species signal. The second species signal is conditioned (step 114). The conditioning may provide chemical shift, rescale intensity, shifted in space, rotated, or another re-orientation or spatial shift, or another mathematical operation may be performed on the second species signal. Other embodiments may not provide this conditioning step.

The first species signal and the second species signal are combined to provide a recombined magnetic resonance image (step 116). The combining of the signals may be a mathematical operation, such as adding the signals to obtain a recombined in-phase image or subtracting signals to obtain a recombined out of phase image, or dividing one signal by another signal to obtain a recombined ratio image, or dividing one signal by the sum of both signals to obtain a recombined proportional image.

In another embodiment of the invention, the first species signal may be combined with a second signal that is not a second species signal. In another embodiment, a first species signal, a second species signal, and a third species signal may be combined.

Preferably, Dixon species separation or iterative least-squared decomposition with echo asymmetry and least squares estimation (IDEAL) is used to acquire the magnetic resonance data and generate the first species signal and the second species signal. In other embodiments, other processes are used.

In an embodiment of the invention that provides spatial shifting of one of the species signals, the chemical shift between two species may be reduced or eliminated. In another embodiment that provides a recombined in-phase and/or out of phase images, an advantage is provided over the prior art, which provided acquired in-phase and out of phase images, because acquired in-phase and out of phase images have a natural ambiguity when different percentages of two species provide the same output, which is removed in forming the recombined in-phase out of phase images. In addition, acquired in-phase and/or out of phase processes are limited to collecting data only at times when the signals of the species are in-phase and/or out of phase. The embodiments of the invention do not have such time limits and therefore may take an arbitrary number of measurements, thus providing measurements more frequently for faster and/or more accurate image generation because of a resulting signal-to-noise benefit. In addition, the conditioning of each species signal allows for correction of RF coil sensitivities, by providing a normalization of each signal, or the correction of other distortions.

The generation of a first species signal and a second species signal from the same magnetic resonance data is described in U.S. patent application Ser. No. 10/690,230, by Reeder et al. entitled "Magnetic Resonance Imaging of Different Chemical Species in a System Having Magnetic Field Heterogeneities," filed on Oct. 23, 2003, which is incorporated by reference for all purposes.

The recombining and/or the conditioning may perform various operations, such as an arithmetic operation, such as multiplying the signal by a factor or adding two signals together or performing another mathematical operation, such as using a trigonometric function or using a logarithmic function of the signal.

An embodiment of the invention uses relaxation times ($T_1$, $T_2$, $T_2^*$) and corrects the relaxation times for quantification of a species. Species that have a short $T_1$ recover faster and therefore have a higher intensity signal, appearing brighter than other species. A correction factor (or weight) may be used to correct this. For short $T_2^*$ periods, the presence of iron may correct the $T_2^*$ measurement. Different species such as fat and water may require different corrections. By providing a separate fat signal and a separate water signal, the different corrections may be provided to the different signals.

More specific details regarding implementation of various embodiments are discussed below.

It was demonstrated that the decomposition of water from fat with symmetrically acquired echoes cannot be achieved when the proportions of water and fat within a voxel are approximately equal. A complete characterization of the theoretical maximum noise performance of water-fat decomposition, including the effects of the field inhomogeneities estimation, was reported in A. Pineda, S. Reeder, Z. Wen, H. Yu, N. Pelc Cramer-Rao, "Bounds for 3-Point Decomposition of Water and Fat", Magn. Reson. Med. (2005) 54(3):625-635 (hereinafter Pineda et al.). This work showed that the theoretical ability of all water-fat separation methods to decompose water from fat in a voxel is dependent on the relative proportions of water and fat, as well as the position of acquired echoes relative to the spin-echo. The dependence on the proportions of water and fat is particularly true for echoes that are acquired symmetrically about the spin-echo. This theory has been extended to spoiled gradient echo imaging (SPGR).

Optimal echo times predicted by Pineda et al. acquire the second of the three echoes in quadrature, re: the phase between the water and fat is such that water and fat are perpendicular to one another i.e. $\pi/2+\pi k$, k=any integer. The first and third echoes are subsequently acquired $2\pi/3$ before and after the second echo, respectively. Such echo combinations have been shown to provide the optimal noise performance for a fat-water separation acquisition. The use of different k-groups permits great flexibility with pulse sequences such as spoiled gradient echo imaging. This has been found and shown by the inventors to be an effective method at both 1.5 and 3.0 T.

H. Yu, S. B. Reeder, C. A. McKenzie et al., in "Single Acquisition Water-Fat Separation: Feasibility Study for Dynamic Imaging", Magn. Reson. Med. (2006) 55(2):413-422, describes a single point technique for reduced data acquisition method for the separation water and fat. In this method, a separate 3-point calibration scan using a standard 3-point IDEAL method is used to acquire a separate field map as well as a constant phase map, which is the phase of water and fat at TE=0. Multiple images are then acquired with the phase between water and fat in quadrature, i.e.: $\pi/2+\pi k$. The effects of the field map and constant phase map are then demodulated from this image in order to obtain an image with water along the real channel and fat signal in the imaginary channel. Separate water and fat images are subsequently obtained from the real and imaginary parts of the demodulated complex image. Although fat-water separation using this "quadrature" method has been proposed previously, this calibration approach has not been previously used. In addition, Yu et al. demonstrated the combination of the 1+ IDEAL method with parallel imaging. In this approach, the calibration image used previously to measure field and phase maps can also be used to measure coil sensitivity maps that are necessary for parallel imaging accelerations. The 1+ method and parallel imaging accelerated 1+ methods are well suited for dynamic contrast enhanced imaging, such as breast imaging for identification of tumors. In such applications, the object of interest (the breast, for example) does not move between the calibration and dynamic contrast enhanced scans. Acquisition of multiple quadrature images makes this method a very rapid and efficient technique capable of robust water-fat separation in minimal scan time. The 1+ method can be extended to a "1++" method by acquiring one full resolution image with water and fat in quadrature, and the other two images are acquired in low resolution. Using the central portions of k-space, low resolution phase and field maps can be calculated, demodulated from the full resolution image, and water and fat are obtained from the real and imaginary portions of the demodulated full resolution quadrature image.

Brau A C, McKenzie C A, Shimakawa A, Yu H, Brittain J H, Reeder S B, in "Optimized 2+ Point IDEAL for Accelerated Water-Fat Separation, in The Radiological Society of North America $91^{st}$ Meeting, Book of Abstracts, December 2005 described a second reduced data acquisition method, known as '2+'. In the 2+ method, two full resolution images of the 'IDEAL' echo times are acquired and a third lower resolution image is also obtained. Using the central lines of k-space that are common to all three images, three low resolution images are obtained after Fourier transformation. Conventional IDEAL estimation is then performed to obtain a low resolution field map from the three low resolution images. The phase shifts generated by the low resolution field map are subsequently demodulated from the two high resolution complex images, and from these demodulated images water and fat separation can be performed in the usual manner with the least-squares estimation. In this way, high resolution, high SNR images with robust water-fat separation can be obtained with an approximately 30 percent scan time reduction from conventional 3-point IDEAL water-fat separation. This scan time reduction is obtained without the use of parallel imaging. In the work by Brau et al., parallel accelerations were also applied. In addition, the low resolution image obtained as part of the fat-water separation acquisition was used as a calibration scan to measure coil sensitivity, necessary for parallel imaging accelerations.

The invention may use any method for fat-water separations such as, and therefore is not limited to IDEAL, which has the potential to measure complex coil sensitivity maps that are free of the effects of chemical shift artifact. Chemical shift artifact may corrupt coil sensitivity maps unless fat signal is suppressed or appropriate corrections have been made. The invention allows IDEAL or related fat-water separation methods to have the potential to correct for chemical shift when computing coil sensitivities as follows: with separated complex water and complex fat images, there will be a relative chemical shift between the two images. The chemical shift in pixels is equal to the chemical shift (Hz)/$BW_{pix}$, i.e.

the amount of chemical shift per $BW_{pix}$. Since the chemical shift is known (e.g. −210 Hz at 1.5 T) and the $BW_{pix}$ is known, the chemical shift artifact is known. For example, with a total BW of ±32 kHz and a 320-sample point readout, the $BW_{pix}=$ 64000/320=200, so that the chemical shift artifact will be −210/200 or just over 1 pixel. Because the water and fat images all have been separated, a simple shift of the fat image to realign it with the water image will correct for chemical shift artifact. This will produce coil sensitivities that are free of the effects of chemical shift artifact and also facilitate the acquisition of calibration maps with lower bandwidths, which improve SNR performance.

In U.S. patent application Ser. No. 10/690,230, by Pelc and Reeder, entitled "Magnetic Resonance Imaging of Different Chemical Species in a System Having a Magnetic Field Heterogeneities" filed on Oct. 20, 2003, which is incorporated by reference for all purposes, teaches using least squares.

As described earlier, IDEAL provides a unique opportunity to correct for chemical shift artifact. As explained above, it does so by realigning water and fat images given the knowledge of the known chemical shift between water and fat. Although this correction is known and has been proposed previously for chemical shift artifact in the read-out direction, an embodiment of the invention uses this in order to correct for chemical shift artifact in the phase encoding direction for sequences that sample multiple time points after the TE, specifically echo planar imaging and related pulse sequences. Echo planar imaging currently relies on spectral-spatial pulses in order to excite only water signal. Unfortunately, these pulses can be very lengthy in duration and are relatively sensitive to $B_0$ inhomogeneities. It is extremely important to provide some form of robust fat suppression for echo-planar imaging because of the very large chemical shift that occurs in the phase encoding direction. For example, the time between subsequent read-out points in an echo-planar acquisition is approximately 1 ms, corresponding to an effective band-width in the phase encoded correction of 1,000 Hz. This corresponds to an approximate band-width per pixel of 5 to 10 Hz. This will result in a shift of fat signal by as much as 20 to 40 pixels, a significant portion of the field of view. This corrupts the image making echo-planar acquisitions without fat suppression non-diagnostic. An echo-planar IDEAL acquisition, however, would have the ability to separate the water and fat signal and subsequently realign them, eliminating the need for other fat suppression methods such as spectral spatial pulses.

The separation of water and fat provides a unique opportunity to recombine images in various combinations that may be helpful for particular diagnostic considerations. For example, with fatty infiltration of the liver or other organs, a "fat fraction image" can be calculated as the proportion of fat signal (fat/(fat+water)) within the liver and may be important to gauge the severity of the disease. In addition, recombined "in-phase" and "out of phase" images calculated as: (abs (water)+abs(fat)) and abs(abs(water)−abs(fat)), respectively, are analogous to in and out of phase imaging that is routinely performed for most MR liver protocols. Other possibilities include a fat:water ratio image (fat/water), and so on.

With separate water and fat images, a variety of new image combinations can be generated. Recombined images can be generated with the simple sum and difference of the calculated water and fat images, analogous to conventional "in-phase" and "out of phase" images that are commonly acquired for adrenal and liver imaging. This is also beneficial to distinguish between benign lesions of the bone from metastases; benign lesions contain fat and show decreased signal with out of phase imaging. Other possible calculated images, such as a "fat fraction" image (i.e.: fat/(water+fat)) or "fat:water ratio" image (i.e.: fat/water) may be beneficial, particularly for quantitative applications such as characterization of hepatic steatosis and microscopic fat seen in adrenal adenomas, and possibly other entities. True quantitative measures of fat content will require knowledge of relaxation parameters within these tissues in order to give absolute measures of fatty infiltration.

Two broad aspects of various embodiments of the invention are:

1. The generation of separate signals and recombination of separated species such as water and fat or other species such as silicone and C-13 metabolites, for example.

2. Correcting relaxation time ($T_1$, $T_2$, $T_2^*$) for quantification of a species. For example, in a preferred embodiment, using spoiled gradient echo imaging (SPRG) which is $T_1$ weighted. Since $T_1$ of fat is shorter than water, the signal contribution from fat is higher. Thus, correction for $T_1$ is necessary.

Pineda et al. performed a comprehensive noise analysis of three-point water-fat separation methods. This work demonstrated that the theoretical optimal combination of echoes for a three-point fast spin-echo (FSE) acquisition occurred when the phase between water and fat phase was: $-\pi/6, \pi/2, 7\pi/6$. This combination of echoes has been applied to FSE imaging using an iterative least-squares water-fat separation method that allows for arbitrarily and unequally spaced echo shifts. Experimental validation of the noise performance showed that the maximum possible SNR of the FSE water and fat images was achieved. This method has been applied to various FSE applications, including the ankle, brachial plexus and cervical spine, as well as balanced steady-state free precession (SSFP) imaging in the knee and heart.

Validation of the noise behavior for GRE imaging is important because the overall predicted noise behavior for gradient echo imaging is different than either FSE or SSFP imaging. It can be shown that the optimal choice of echoes that maximizes the noise performance of magnitude images leads to lower noise performance for the phase and field map for GRE imaging, compared to FSE or SSFP. This is related to the fact that all echo shifts for GRE imaging must be greater than zero, while echo shifts can be negative for FSE because echoes can be acquired before the refocusing of the spin-echo. This effect also occurs with SSFP, because of the 180° relative phase shift between water and fat at TE=TR/2 for certain choices of TR. Therefore, experimental validation of the noise performance for IDEAL-GRE imaging is necessary in order to show that the optimal noise performance is achievable even in the presence of higher uncertainty in the phase and field maps.

For the combining of IDEAL with GRE imaging at 1.5 T and 3.0 T, experimental validation of the noise performance of the water-fat separation was performed in order to optimize noise performance and overall image quality. clinical results, including examples of imaging in the liver, breast, knee, ankle, and heart are shown. Finally, the recombination of water and fat images in new ways such as "fat fraction" images is described, and may be helpful for the quantification of fatty infiltration or other pathologies.

Theory:

Noise Performance

The noise performance of a water-fat decomposition is conveniently described with the effective number of signal averages, or NSA, defined as $$NSA = \frac{\sigma^2}{\sigma_\rho^2} \quad (1)$$

where $\sigma^2$ is the various of the noise in a source image and $\sigma_\rho^2$ is the variance of the noise in a calculated water or fat image. The NSA is a useful measure of the noise performance of a water-fat decomposition, and has an intuitive basis: For any three-point water-fat decomposition method, the maximum possible NSA is three, which is equivalent to what would be obtained if the object contained only water or only fat, and the three source images were averaged. Eq. 1 will be used experimentally to determine the noise performance of the IDEAL-GRE method.

Optimal Echo Shifts

The phase shift between water and fat from an echo acquired at time t relative to TE=0, can be written, $$\theta = 2\pi \Delta f t \quad (2)$$

where $\Delta f$ is the chemical shift between water and fat, (−210 Hz at 1.5 T and −420 Hz at 3.0 T). Phase shifts are more convenient than echo shifts, because they are independent of field strength and are more intuitive, providing more physical meaning to the water-fat separation problem.

As predicted by Pineda et al., one set of optimal echo shifts for the three images occur when the water-fat phase is, $1^{st}$ echo: $-\pi/6 + \pi k$ $2^{nd}$ echo: $\pi/2 + \pi k$ $3^{rd}$ echo: $7\pi/6 + \pi k$, k=any integer (3)

This echo combination has an intuitive basis as follows. In the "perfect" NMR experiment, there are no constant phase shifts or $B_o$ inhomogeneities, and an image acquired with an echo time that has water and fat in quadrature, i.e.: $\pi/2 + \pi k$, can be used to separate water from fat with that single image: water and fat are simply the real and imaginary components of the complex image. However, the presence of unknown constant phase shifts and $B_o$ inhomogeneities requires additional information. The acquisition of two additional images 120° ($2\pi/3$) before and after the second echo located at $\pi/2 + \pi k$ provides uniform sampling around the unit circle, providing the optimal noise performance in the estimation of water and fat from the three source images. It is important to note, that the center echo must be in quadrature; echo combinations with the first or third echo in quadrature will not have optimum noise performance.

Echo shifts that satisfy Eq. 3 will have optimal noise performance. However, noise performance is poor when the second echo is acquired when water and fat are aligned, i.e.: any multiple of $2\pi$, even if the spacing between all three echoes remains at $2\pi/3$. In this case, the NSA is three when a voxel contains all water, but is significantly reduced for voxels that contain all fat, and has a broad minimum approaching zero for voxels containing mixtures of water and fat in near equal proportions. This echo combination can lead to image artifacts that include irregular margins at the interface between tissues with water signal (e.g. muscle) and fat signal (e.g. subcutaneous fat), as a result of partial volume effects. In addition, areas of the calculated water image that contain mostly fat signal (e.g. bone marrow and subcutaneous fat) appear noisy.

The choice of echo group, determined by the echo group index k, will depend on the minimum TE ($TE_{min}$) of the sequence. Typically, k is chosen to minimize the echo times, but ensure that they are all greater than $TE_{min}$. For example, at 1.5 T one possible echo combination for IDEAL-GRE imaging occurs for k=1, with echo shifts of 2.0 ms, 3.6 ms and 5.2 ms, so long as $TE_{min}$ is 2.0 ms or less. It is worthwhile to note that spacing between echo groups decreases with increasing field strength: the time between consecutive echo groups at 1.5 T is approximately 2.4 ms compared to a spacing of 1.2 ms at 3.0 T. The decrease in time between echo groups and the fact that echoes within a group are more closely spaced with increasing field strength, makes IDEAL more flexible and more efficient for imaging at 3.0 T.

Pulse Sequence and Image Reconstruction

IDEAL uses an iterative least-squares method that is compatible with multi-coil imaging. In this method, an iterative method is used to determine the local field map ($B_o$ inhomogeneity) in the least squares sense. The field map is subsequently demodulated from the signal in the source images. This signal is then decomposed into separate water and fat signals using a least-squares solution matrix inversion. This latter step is similar to a least-squares approach described in L. An, Q. S. Xiang, "Chemical Shift Imaging with Spectrum Modeling", Magn. Reson. Med. (2001) 46(1):126-130 (hereinafter An), which are restricted to equally spaced echo shifts. IDEAL uses a region growing reconstruction algorithm to prevent water-fat "swaps" that can occur from the natural ambiguity between water and fat signals, e.g. for an acquisition at 1.5 T with the center frequency set to water, water that is off-resonance by −210 Hz has similar signal to fat that is on-resonance.

Figure 4:
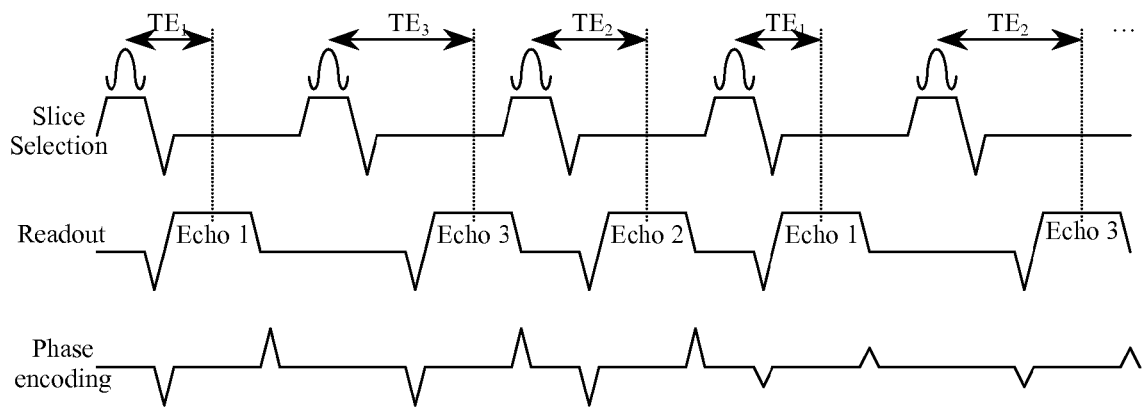
FIG. 4 is a graph illustrating interleaved echo times used in an embodiment of the invention.

In order to reduce the effects of motion and the possibility of misregistration between subsequent echoes, acquisitions at different echo times are interleaved as shown in FIG. 4. For each phase encoding step, the three echoes were acquired in the following order: $TE_1, TE_3, TE_2, TE_1, TE_3, TE_2 \ldots$, where $TE_1 < TE_2 < TE_3$. In this way, the spacing between the readout gradients is the most uniform between subsequent TRs, and prevents the short spacing between $TE_3$ and $TE_1$ that would result if the echoes were interleaved in increasing order, (ie: $E_1, TE_2, TE_3, TE_1, TE_2, TE_3 \ldots$). Ghosting artifacts in the phase encoding direction were occasionally observed in source images when the echoes were interleaved with increasing spacing. Eddy currents generated from the readout gradient were thought to be a likely cause. No artifacts were observed using the proposed echo order.

Materials and Methods:

All scanning was performed at 1.5 T (Signa TwinSpeed, GE Healthcare, Milwaukee, Wis.) and 3.0 T (Signa VH/i, GE Healthcare, Waukesha, Wis.). Human scanning was performed with informed consent and approval of our institutional review boards. Modified 2D and 3D-GRE pulse sequences were used to acquire three images with different echo shifts. The phase encoding gradient was rewound, and RF spoiling was used to prevent coherences in the transverse magnetization for SPGR imaging.

Phantom experiments were performed to validate the noise behavior of the water-fat decomposition. A spherical phantom consisting of peanut oil floating on 0.9% normal saline doped with 5 mM $NiCl_2$ was imaged at 1.5 T with the 2D-SPGR pulse sequence. From an axial scout image, a thick slice was oriented through the water-fat interface in order to create a continuum of fat:water ratios. Imaging was peformed with a single channel extremity coil and the following parameters were used: Nx=256, Ny=256, 1 excitation, FOV=24 cm, slice=10 mm, BW=±83.3 kHz, TR=10.0 ms, flip=20°. Product automated linear shim routines were used. The flip angle was chosen empirically to produce similar signal intensity from water and fat. Acquisition was performed with IDEAL echoes with the second echo acquired in quadrature ($5\pi/6, 3\pi/2, 13\pi/6$): echo times=1.98, 3.57, 5.16 ms at 1.5 T, and for an "aligned" echo combination ($4\pi/3, 2\pi, 8\pi/3$): echo times=3.18, 4.76, 6.35 ms. For each echo combination, the acquisition was repeated 256 times (scan time=32:45 min).

NSA was calculated for individual pixels based on Eq. 1, by calculating the variance in the signal for each pixel over all 256 source images ($\sigma^2$), and the variance for the corresponding pixel over all 256 calculated water images ($\sigma_\rho^2$). The variance of the signal was calculated from the source images as the average variance from the three echo shifts. Pixels outside the phantom were excluded using a threshold mask. For each pixel, the fat:water ratio was calculated from the average of all water and the average of all fat images, and scatter plots of measured NSA vs. fat:water ratio were made. The NSA calculations were performed with off-line programs written in Matlab 6.0 (Mathworks, Natick, Mass.).

Knee, ankle, breast, liver, and cardiac images were acquired from healthy volunteers and patients. Fat-saturated GRE images were acquired for comparison in many cases. Abdominal imaging was performed using an eight channel torso phased array coil, knee and ankle imaging was performed with a product extremity coil, breast imaging was performed with a four channel dedicated phased array breast coil, and cardiac imaging was performed using a four channel phased array torso coil. Parallel imaging was often performed for abdominal and breast images acquired with phased array coils, to reduce scan time. Such accelerations were performed with a modified implementation of a image based unwrapping algorithm (ASSET, GE Healthcare, Waukesha, Wis.). All water-fat decomposition calculations were performed on-line with a reconstruction algorithm based on the iterative least-squares algorithm, which can perform multi-coil reconstructions. Such calculations are described in S. B. Reeder, Z. Wen, H. Yu, et al., "Multicoil Dixon Chemical Species Separation with an Iterative Least-Squares Estimation Method", Magn. Reson. Med. (2004) 51:35-45, and H. Yu, S. Reeder, A. Shimakawa, J. Brittain, N. Pelc, "Field Map Estimation with a Region Growing Scheme for Iterative 3-Point Water-Fat Decomposition", Magn. Reson. Med. (2005) 54(3):1032-1039.

Figure 5:
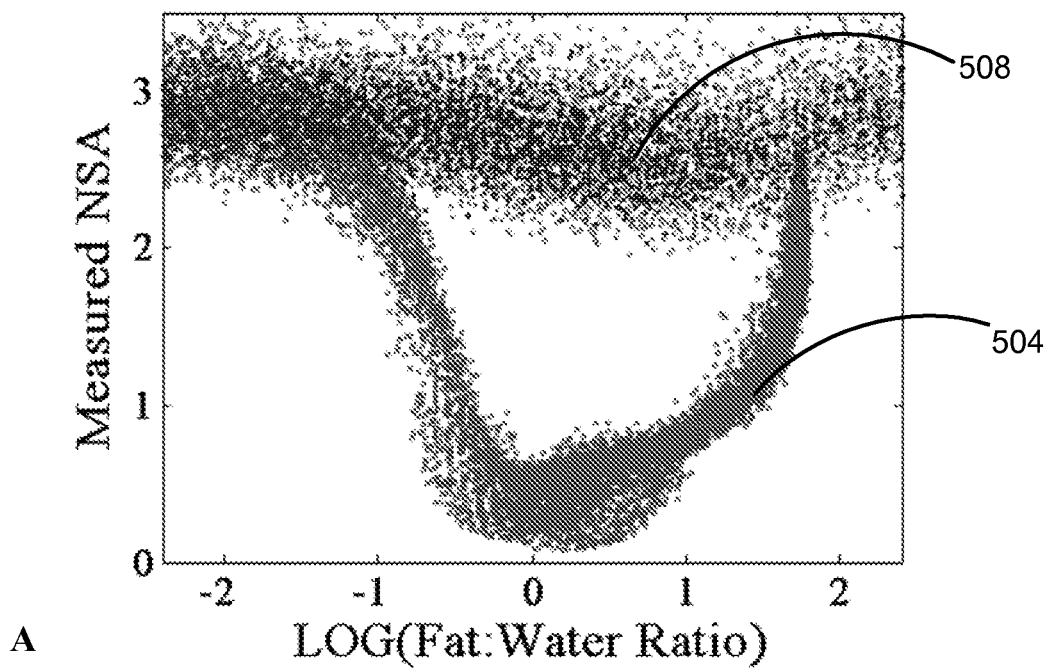
FIG. 5 is a plot of measured values of the effective NSA from the phantom experiment against fat:water ratio for two sets of echo combinations.

Results:

FIG. 5 plots measured values of the effective NSA from the phantom experiment, against fat:water ratio for two sets of echo combinations. Data points forming the lower curve 504, acquired with the aligned combination ($4\pi/3, 2\pi, 8\pi/3$), demonstrate a broad minimum that occurs for pixels that contain similar amounts of water and fat. Data points plotted in the upper curve 508, acquired with the IDEAL quadrature echo combination ($5\pi/6, 3\pi/2, 13\pi/6$), show uniform NSA of approximately three for all fat:water ratios. The data from the quadrature case 508 were fitted to the linear equation: NSA=slope*$\log_{10}$(fat:water ratio)+intercept. The intercept and slope were calculated to be 2.749±0.003, and −0.05±0.002, respectively. This indicates that the slope of the fitted line is flat, and the intercept is close to, although slightly lower than the expected maximum of three.

Figure 6A:
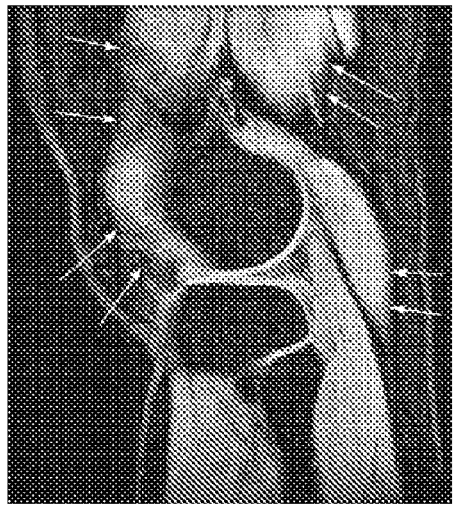
FIGS. 6A-C show IDEAL-SPGR knee images acquired with two different echo combinations.
Figure 6B:
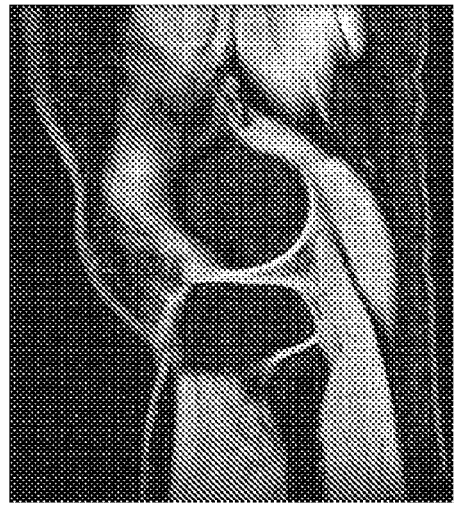
Figure 6C:
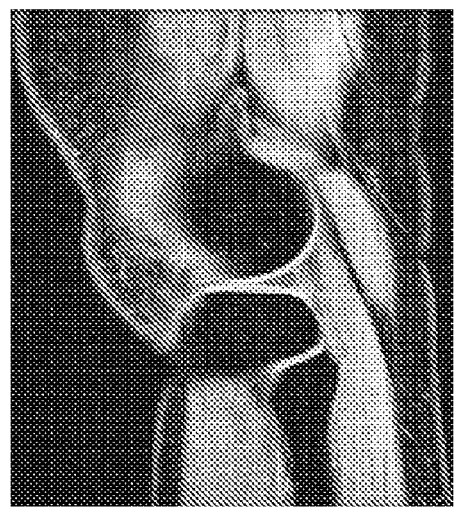
Figure 7A:
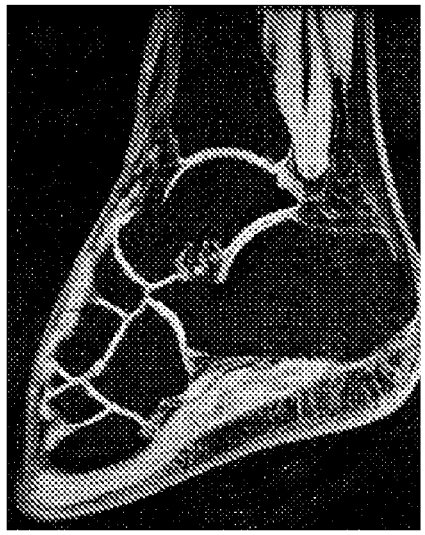
FIGS. 7A-D show examples of high resolution 3D-IDEAL-SPGR.
Figure 7B:
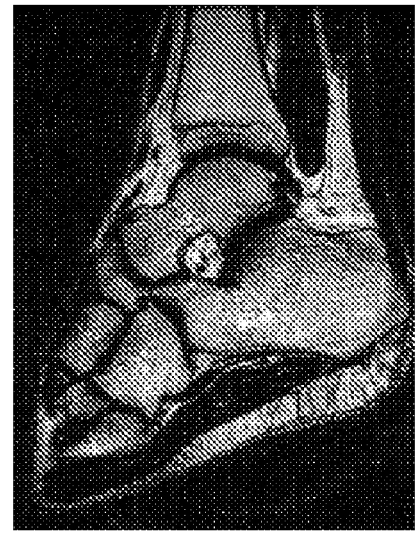
Figure 7C:
Figure 7D:
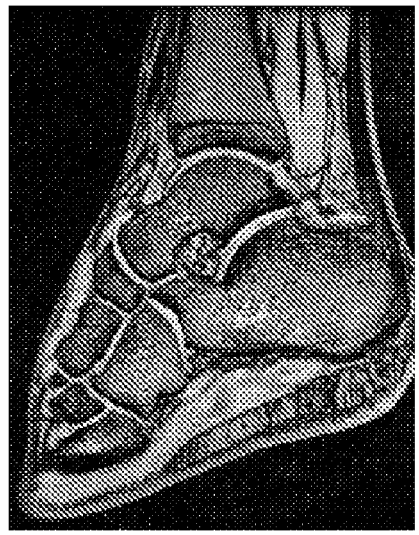
Figure 8A:
FIGS. 8A-D show additional examples of high resolution 3D-IDEAL-SPGR.
Figure 8B:
Figure 8C:
Figure 8D:

IDEAL-SPGR knee images acquired with two different echo combinations are shown in FIGS. 6A-C, demonstrating image artifacts caused by the NSA performance shown in FIG. 5, using the aligned echo combination. Irregular margins at the interface between muscle (water signal) and subcutaneous fat are seen in images acquired with the phase of water and fat aligned for the second echo (FIG. 6A). Images acquired with the phase of water and fat of the second echo in quadrature (FIG. 6B), however, do not have these artifacts and have very similar image quality to conventional fat-saturated images that are shown for comparison (FIG. 6C). Image parameters for these acquisitions included: 384×192×50 matrix, FOV=16 cm, slice=4 mm, TR=9.57 ms, TE=3.96/4.76/5.55 ms for the "aligned" combination, TE=3.37/4.17/4.96 ms for the quadrature combination (k=3), BW=±62.5 kHz, and flip angle of 8°.

Examples of high resolution 3D-IDEAL-SPGR are shown in FIGS. 7A-D, including water-only (FIG. 7A), fat-only (FIG. 7B), recombined in-phase (FIG. 7C), and recombined out of phase (FIG. 7D) images from the ankle of a normal volunteer. Image parameters for the ankle imaging included: 512×256×60 matrix, FOV=20 cm, slice=1.5 mm, TR=9.28 ms, TE=3.37/4.17/4.96 ms (k=3), BW=±62.5 kHz, flip=8°, and a total scan time of 7:07 min covering the entire ankle with 0.4×0.8×1.5 mm³ voxel resolution. Excellent depiction of the cartilage of the subtalar and talar joints of the ankle and foot are noted, and uniform separation of water and fat was seen across all images. Additional examples of high resolution 3D-IDEAL-SPGR are shown in FIGS. 8A-D, including water-only (FIG. 8A), fat-only (FIG. 8B), recombined in-phase (FIG. 8C), and recombined out of phase (FIG. 8D) images from the breasts of a second, normal volunteer. Imaging parameters for the breast imaging included: 512×256×48, FOV=32 cm, slice=4 mm, TR=10.6 ms, BW=±83 kHz, TE=4.56/5.36/6.15 ms (k=4) covering both breasts in 2:10 min using a parallel acceleration factor of two with 0.6×1.2×4 mm³ resolution. Uniform suppression was seen across both breasts in all slices.

Figure 9A:
FIGS. 9A-E show images acquired at 3.0 T from a patient with fatty infiltration of the liver (hepatic steatosis).
Figure 9B:
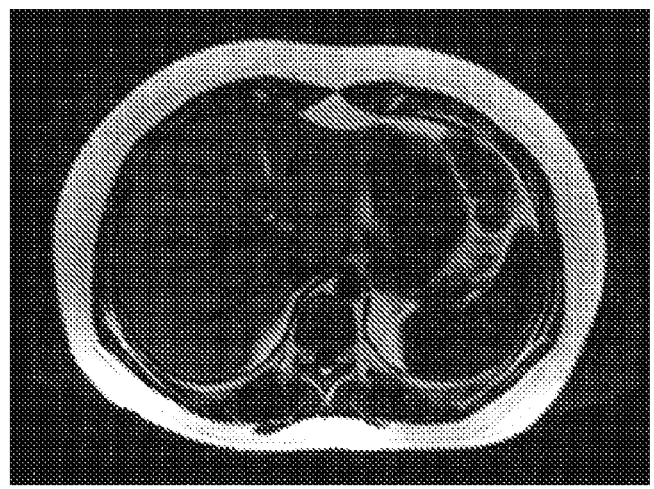
Figure 9C:
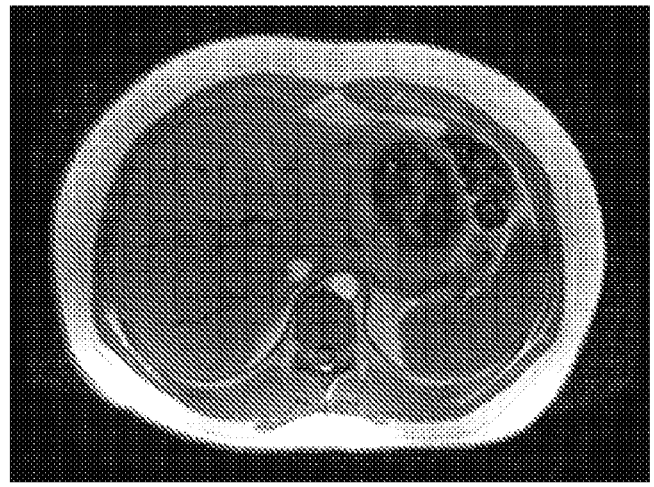
Figure 9D:
Figure 9E:
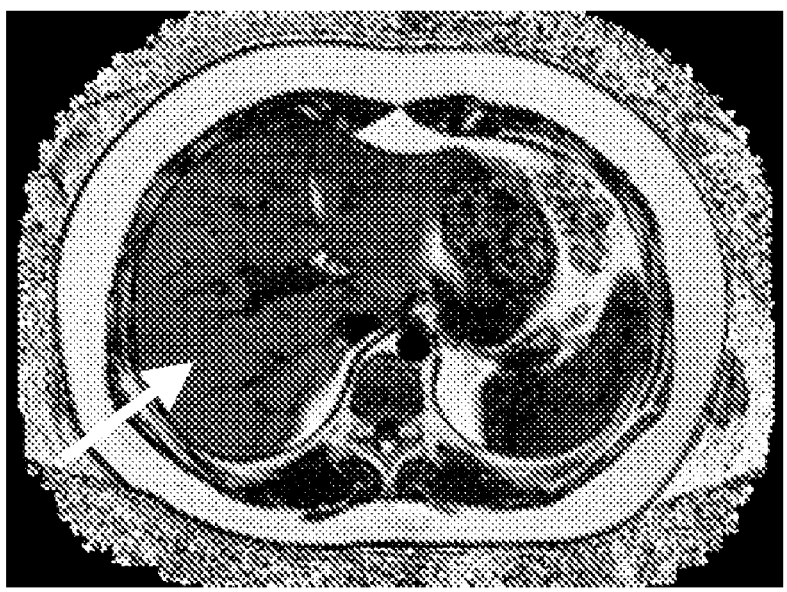
Figure 9E:
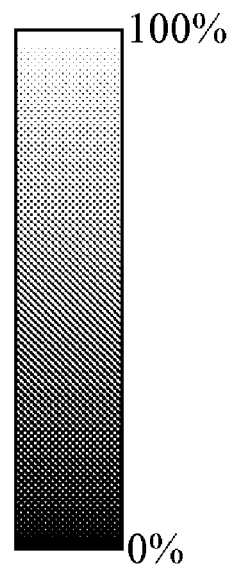

Images acquired at 3.0 T from a patient with fatty infiltration of the liver (hepatic steatosis) are shown in FIGS. 9A-E. FIGS. 9A and 9B show the separated water and fat images, respectively. These images are then recombined into water+fat ("in-phase", FIG. 9C) and water-fat ("out of phase", FIG. 9D) images, as well as a fat fraction image (F/(W+F), FIG. 9E). Fatty infiltration can be visualized as low level signal in the liver in the fat image, as well as signal decrease in the calculated out of phase image, relative to the in-phase image. In addition, a "fat fraction" image displays the proportion of signal from the fat image, calculated on a pixel-by-pixel basis as fat/(water+fat). Image parameters for this acquisition include: 256×160×16 (interpolated to 32 slices), 38×34 cm FOV, slice=7 mm (interpolated to 3.5 mm), TE=2.2/3.0/3.8 ms (k=2), TR=6.1 ms, BW=±83 kHz, 18° flip and a parallel acceleration of 2, for a total breath-hold time of 21 s.

Figure 10A:
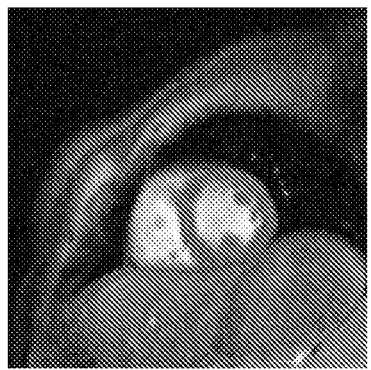
FIGS. 10A-I show cardiac CINE 2D-IDEAL-SPGR images acquired at 1.5 T during breath-holding in a healthy volunteer.
Figure 10B:
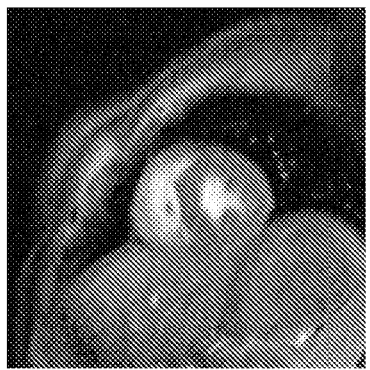
Figure 10C:
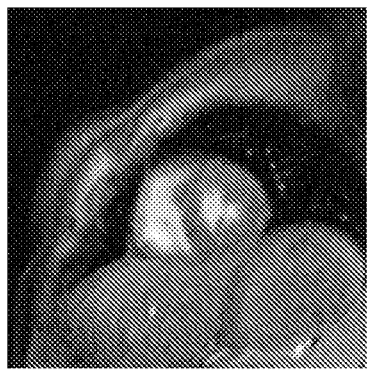
Figure 10D:
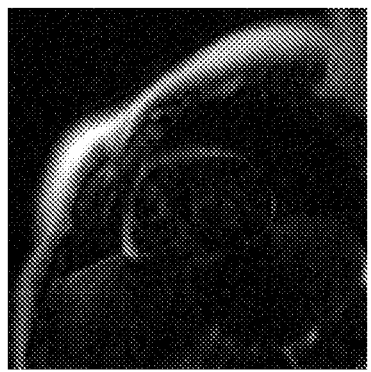
Figure 10E:
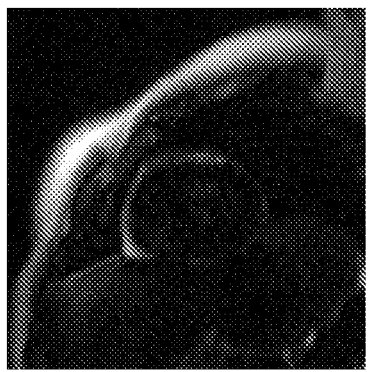
Figure 10F:
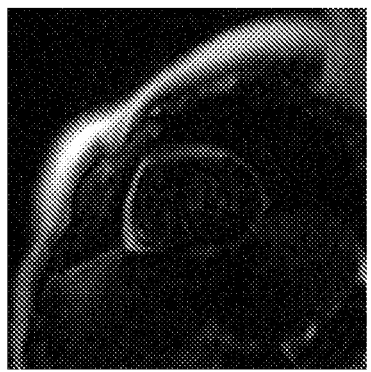
Figure 10G:
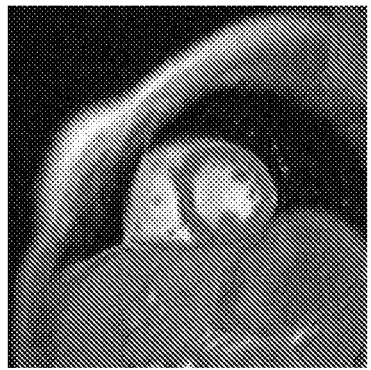
Figure 10H:
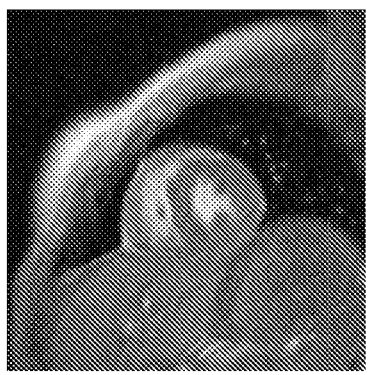
Figure 10I:
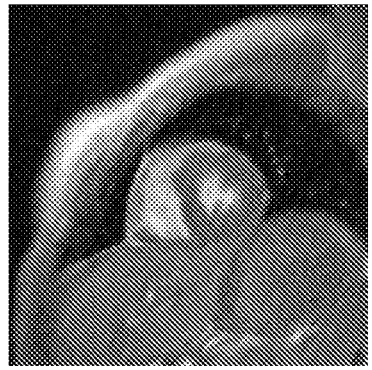

Finally, FIGS. 10A-I shows cardiac CINE 2D-IDEAL-SPGR images acquired at 1.5 T during breath-holding in a healthy volunteer. Only three of twenty (end diastole, mid systole, end systole) time frames acquired are shown. Image parameters include: 224×128, FOV=32 cm, slice=8 mm, BW=±62.5 kHz, TR=5.3 ms, and segmentation factor=16, providing spatial resolution of 1.4×2.5×8 mm³ and 85 ms temporal resolution. The TE increment was limited to 1.0 ms, such that the three echo times were 0.96 ms, 1.96 ms and 2.96 ms. The minimum possible TE values were used in order to shorten TR, necessary to obtain all data within a 20-25 s breath-hold, while maintaining reasonable spatial and temporal resolution. FIGS. 10A-C are water only images, the second row (FIGS. 10D-F) are fat only images, and the third row (FIGS. 10G-I) are recombined water+fat images. The first column of each row (FIGS. 10A,D,G) are end-diastolic images, the middle column (FIGS. 10B,E,H) are mid-systolic images, and the right column (FIGS. 10C-I) are end-systolic images.

By using optimized echo shifts where the phase shift between water and fat of the central echo is in quadrature ($\pi/2+\pi k$), and the first and third echoes are acquired $2\pi/3$ before and after the central echo, respectively, the maximum SNR performance can be achieved. These combinations of echoes also avoid image artifacts that are related to the noise performance of all water-fat separation methods, which in general, depends on the water/fat composition of a voxel.

Noise behavior, as quantified experimentally with the NSA, showed good agreement with theoretical predictions. The experimental data for the quadrature echo combination was in close agreement with the predicted theoretical maximum of three, providing high SNR performance for all fat/water combinations. A marked decrease in noise performance was seen for intermediate combinations of water and fat. The qualitative behavior was very similar to that seen previously for FSE with an asymmetric NSA curve; however, the broad minimum of the GRE data appears somewhat wider. This may have occurred because the theoretical predictions for NSA assumed very high SNR source images, and the prior experiments were made with FSE images that had very high SNR. Regardless, the data from the quadrature echo combination shows good agreement with the theoretical maximum of three for all fat:water ratios and shows tremendous improvement from the aligned echo combination.

The theoretical work by Pineda et al., also showed that the spacing between the echoes could also be other multiples of $2\pi/3$. For example, spacing between echoes of $4\pi/3$ or $8\pi/3$ (but not $6\pi/3=2\pi$) would also provide the optimal noise performance. For echoes acquired in different TRs, combinations with longer spacing than necessary should be avoided to avoid effects of $T_2^*$. Longer echo spacing may be useful for multi-echo water-fat separation methods, such as that described in O. Wieben, J. Leupold, S. Mansson, J. Hennig, "Multi-Echo Balanced SSFP Imaging for Iterative Dixon Reconstruction," (2005) The International Society of Magnetic Resonance 13th Meeting, p. 2386, to increase the sequence flexibility allowing long readout windows that are necessary for low bandwidth and/or high matrix size imaging.

IDEAL is a highly SNR efficient method, using the information acquired in the source images very efficiently in the estimation of the calculated water and fat images. In fact, IDEAL is much more efficient than applications that use conventional fat saturation pulses: the decrease in sequence efficiency from echo shifting is less than the time required to execute fat-saturation pulses. However, IDEAL requires a longer minimum scan time based on the need to acquire three images with different echo times. This makes IDEAL particularly well suited for applications that already use multiple averages such as cartilage imaging where the limiting factors of conventional fat-saturated SPGR are SNR and image resolution. Improving sequence efficiency permits improved SNR and/or image resolution within the same scan time.

Because an embodiment of the invention uses IDEAL, this embodiment can use arbitrarily spaced echoes, other echo combinations can be used, and small deviations from the optimal echo choices have minimal impact on noise performance if these deviations are small. This increased flexibility may be valuable in the case where $TE_{min}$ just exceeds the minimum echo time of a particular echo group. For most GRE applications, speed and sequence efficiency are the most important priority and the shortest echo group is chosen; however, $T_2^*$ weighted images are easily generated by increasing the echo group index.

With separate water and fat images, a variety of new image combinations can be generated. Recombined images can be generated with the simple sum and difference of the calculated water and fat images, analogous to conventional "in-phase" and "out of phase" images that are commonly acquired for adrenal and liver imaging. This is also beneficial to distinguish between benign lesions of the bone from metastases; benign lesions contain fat and show decreased signal with out of phase imaging. Other possible calculated images, such as a "fat fraction" image (i.e.: fat/(water+fat)) or "fat:water ratio" image (i.e.: fat/water) may be beneficial, particularly for quantitative applications such as characterization of hepatic steatosis and microscopic fat seen in adrenal adenomas, and possibly other entities. True quantitative measures of fat content will require knowledge of relaxation parameters within these tissues in order to give absolute measures of fatty infiltration.

Chemical shift artifact can be corrected with IDEAL because the water and fat have been separated into different images that can be realigned. Chemical shift correction is routinely performed in the IDEAL reconstruction and presents a new opportunity for improved SNR performance by imaging at lower bandwidths and higher field strengths without increases in bandwidth, while avoiding chemical shift artifact in the recombined images. Typically, the lower limit of image bandwidth is determined by the level of chemical shift artifact. Chemical shift artifact correction with IDEAL may be routinely performed.

IDEAL is particularly well suited for imaging at 3.0 T because the chemical shift between water and fat doubles from approximately −210 Hz at 1.5 T to −420 Hz. As a result, the spacing between echoes is reduced in half, improving the overall efficiency of the pulse sequence by reducing the minimum TR of the sequence. In addition, the spacing between consecutive echo groups is also smaller (1.2 ms at 3.0 T vs. 2.4 ms at 1.5 T), which also improves sequence efficiency and flexibility while still imaging with an optimal echo combination.

In order to prevent motion blurring caused by spatial misregistration of images acquired at different echo times, and therefore within different TRs, echoes for the three images were interleaved. For each line of k-space, echoes at the three different echo times were sequentially acquired. In this way, the longest duration between lines of k-space for the three different echo times was two times TR, approximately 10-20 ms, depending on image parameters. In addition, the echoes were interleaved in such a way that the shortest echo time ($TE_1$) was followed by the longest echo time ($TE_3$) and finally the second echo ($TE_2$), to create the most equal spacing possible between the readout gradient waveforms. This echo ordering prevented subtle ghosting artifacts occurred when interleaved echoes were acquired in a sequential manner, i.e.: $TE_1$, $TE_2$, $TE_3$.

The main disadvantage of IDEAL-GRE imaging is its long minimum scan time compared with conventional GRE imaging, which may be problematic for breath-held applications and dynamic contrast enhanced imaging. Despite the increased scan time, IDEAL is a very SNR efficient pulse sequence when the optimal echo spacing is used, generating separate water and fat images with SNR equivalent to three averages of a single image acquisition. For multi-coil applications, this problem can be addressed in part by using parallel imaging accelerations. As shown in several examples above, parallel imaging is fully compatible with IDEAL water-fat decomposition. For low acceleration factors (R=2-3), the SNR losses from the parallel acceleration are completely offset by the high SNR efficiency of IDEAL, making these methods highly complementary. Details of this work are described in H. Yu, S. Reeder, A. Shimakawa, J. Brittain, N. Pelc, "Field Map Estimation with a Region Growing Scheme for Iterative 3-Point Water-Fat Decomposition", Magn. Reson. Med. (2005) 54(3):1032-1039. Other methods that can help reduce scan time include partial $k_y$ and $k_z$ acquisitions reconstructed with new homodyne algorithms compatible with IDEAL, as well as reduced acquisition schemes that include two-point and single-point acquisition methods.

U.S. patent application Ser. No. 11/738,340 by Charles A. McKenzie et al., entitled "SELF-CALIBRATION METHODS FOR PARALLEL IMAGING AND MULTIPOINT WATER-FAT SEPARATION METHODS" filed concurrently herewith, teaches self-calibration methods for parallel imaging and multipoint water-fat separation methods; U.S. patent application Ser. No. 11/738,343 by Angel R. Pineda et al., entitled "MAXIMUM LIKELIHOOD ESTIMATOR IN THE PRESENCE OF NON-IDENTICALLY DISTRIBUTED NOISE FOR DECOMPOSITION OF CHEMICAL SPECIES IN MRI" filed concurrently herewith, teaches maximum likelihood estimator in the presence of non-identically distributed noise for decomposition of chemical species in MRI; U.S. patent application Ser. No. 11/738,345 by Zhifei Wen et al., entitled "REGULARIZED SPECIES SEPARATION" filed concurrently herewith, teaches regularized species separation; U.S. patent application Ser. No. 11/738,347 by Huanzhou Yu et al., entitled "SLIDING WINDOW RECONSTRUCTION AND PHASE/FIELD MAP UPDATING FOR DYNAMIC CHEMICAL SHIFT IMAGING" filed concurrently herewith, teaches sliding window reconstruction and phase/field map updating for dynamic chemical shift imaging; U.S. patent application Ser. No. 11/738,350 by Huanzhou Yu et al., entitled "SIMULTANEOUS CHEMICAL SPECIES SEPARATION AND $T_2$* MEASUREMENT USING MRI" filed concurrently herewith, teaches simultaneous chemical species separation and $T_2$* measurement using MRI; U.S. patent application Ser. No. 11/738,352 by Charles A. McKenzie et al., entitled "CALIBRATION MAPS FOR PARALLEL IMAGING FREE OF CHEMICAL SHIFT ARTIFACT" filed concurrently herewith, teaches calibration maps for parallel imaging free of chemical shift artifact, all of which are incorporated by reference herein.

While this invention has been described in terms of several preferred embodiments, there are alterations, permutations, modifications and various substitute equivalents, which may fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for generating a magnetic resonance images, comprising:
    a) generating a first species signal for a first species from magnetic resonance data;
    b) generating a second signal from the magnetic resonance data, wherein the second signal is a second species signal for a second species different than the first species and wherein the second species signal is generated from the same magnetic resonance data as the first species signal;
    c) conditioning at least one of the first species signal or second species signal before combining the first species signal with the second species signal; and
    d) combining the first species signal with the second signal to provide a recombined image.

2. The method, as recited in claim 1, wherein the first species is fat and the second species is water to provide a water fat signal separation.

3. The method as recited in claim 2, wherein the water fat signal separation employs Dixon water-fat separation, iterative least-squared decomposition with echo asymmetry and least squares estimation (IDEAL), or similar chemical shift based water-fat separation methods.

4. The method, as recited in claim 3, wherein the combining is based on a mathematical recombination.

5. The method, as recited in claim 4, wherein the mathematical recombination is selected from in-phase imaging, out of phase imaging, ratio imaging, and proportion imaging.

6. The method, as recited in claim 5, wherein the conditioning comprises at least one of rescaled in intensity, shifted in space, rotated, or other re-orientation.

7. The method of claim 3, wherein the generating the first species signal and the generating the second signal uses relaxation times ($T_1$, $T_2$, $T_2$*), wherein the relaxation times are corrected for quantification of a species.

8. The method of claim 3, further comprising generating a third species signal for a third species different than the first species and second species, wherein the third species signal is generated from the magnetic resonance data and wherein the combining the first species signal and the second signal also combines the third species signal to provide the combined image.

9. The method, as recited in claim 1, wherein the combining is based on a mathematical recombination.

10. The method, as recited in claim 9, wherein the mathematical recombination is selected from in-phase imaging, out of phase imaging, ratio imaging, and proportion imaging.

11. The method, as recited in claim 1, wherein the conditioning comprises at least one of rescaled in intensity, shifted in space, rotated, or other re-orientation.

12. The method of claim 1, further comprising generating a third species signal for a third species different than the first species and second species, wherein the third species signal is generated from the magnetic resonance data and wherein the combining the first species signal and the second signal also combines the third species signal to provide the combined image.

13. The method of claim 1, further comprising:
    applying a magnetic resonance imaging excitation;
    acquiring magnetic resonance data; and
    displaying the recombined image.

14. A method for generating a magnetic resonance images, comprising:
    a) applying a magnetic resonance imaging excitation;
    b) acquiring magnetic resonance data;
    c) generating a fat species signal from the acquired magnetic resonance data;
    d) generating a water species signal from the acquired magnetic resonance data;
    e) at least one of rescaling in intensity, shifting in space, rotating, or re-orientating at least on of the fat species signal or water species signal before mathematically combining;
    f) mathematically combining the fat species signal with the water species signal to provide a recombined image; and
    g) displaying the recombined image.

15. An apparatus for providing magnetic resonance images, comprising:
    a magnet system;

a controller electrically connected to the magnet system, comprising:

a display;

at least one processor; and computer readable media, comprising:

computer readable code for signaling the magnetic system to apply a magnetic resonance imaging excitation;

computer readable code for signaling the magnetic system to acquire magnetic resonance data;

computer readable codes for generating a fat species signal from the acquired magnetic resonance data;

computer readable code for generating a water species signal from the acquired magnetic resonance data;

computer readable code for conditioning at least one of the water species signal or fat species signal before mathematically combining the water species signal with the fat species signal;

computer readable code for mathematically combining the fat species signal with the water species signal to provide a recombined image; and computer readable code for displaying the recombined image.

\* \* \* \* \*